United States Patent [19]

Dard

[11] Patent Number: 4,642,518
[45] Date of Patent: Feb. 10, 1987

[54] INSTALLATION OF ELECTRON BEAM METALWORKING

[75] Inventor: Philippe Dard, Boussy St Antoine, France

[73] Assignee: Sciaky S.A., Vitry sur Seine (Val de Marne), France

[21] Appl. No.: 711,911

[22] Filed: Mar. 14, 1985

[30] Foreign Application Priority Data

Mar. 23, 1984 [FR] France .................. 84 04559

[51] Int. Cl.$^4$ .................................. H01J 23/34
[52] U.S. Cl. .................... 315/1.0; 250/310; 250/309; 328/67; 315/3.0; 315/200 R; 315/307
[58] Field of Search ............... 315/1, 3, 200 R, 307; 328/67, 76; 250/309, 310

[56] References Cited

U.S. PATENT DOCUMENTS

| | | | |
|---|---|---|---|
| 2,465,406 | 3/1949 | Taylor | 315/1 |
| 3,300,735 | 1/1967 | Badger | 315/1 |
| 3,710,266 | 1/1973 | Kondo | 250/309 |
| 4,315,195 | 2/1982 | Redel et al. | 315/107 |

FOREIGN PATENT DOCUMENTS

| | | |
|---|---|---|
| 2456384 | 5/1980 | France . |
| 2533070 | 9/1982 | France . |
| 833762 | 4/1960 | United Kingdom . |
| 2081941 | 8/1980 | United Kingdom . |

*Primary Examiner*—Harold Dixon
*Attorney, Agent, or Firm*—Seidel, Gonda, Goldhammer & Abbott

[57] ABSTRACT

An installation for electron beam metalworking comprises an electron gun (1), a transformer and rectifier system producing a rectified high voltage supplied to the gun, a vacuum tube (23) disposed in the circuit and associated with means (21) sensitive to the current flowing through the circuit and adapted to interrupt the current when it exceeds a predetermined value. The circuit is characterized in that the positive terminal of the rectifier is connected to the gun anode (4) by way of earth (the reference potential) and the vacuum tube (23) associated with its current flow sensiive means (21) is disposed in the connection between the negative terminal of the rectifier (19) and the gun cathode (3).

6 Claims, 4 Drawing Figures

INSTALLATION OF ELECTRON BEAM METALWORKING

The invention relates to an installation for electron beam metalworking.

This technology calls for machines or installations having a vacuum work chamber with which an electron beam generator known as an electron gun is associated.

In an electron gun electrons are removed from an emissive surface and accelerated by a high voltage of the order of 100 or 200 kV to acquire an appropriate energy, then concentrated at a place on the workpiece which it is required to treat to melt it or drill it or weld it or carry out any other operation.

The various gun operations by which a concentrated electron beam can be provided must be carried out in a high vacuum in which the between-electrodes distances are small as compared with the potentials applied to the electrodes. Compact electron guns are therefore provided which can be introduced into and moved in the chambers themselves.

Power supply for the guns is provided by three-phase or six-phase or twelve-phase transformer and rectifier systems whcih output power at the required voltage and current.

The gun supply voltage is usually controlled on the primary side of the transformer and rectifier system by electromechanical variostats, series controllers using transistors or thyristors and so on, at the maker's choice.

These primary-side control means are adapted to switch on power when it is required to produce the beam, to adjust and regulate the secondary high voltage applied to the gun in dependence upon mains voltage variations and upon load and to switch the system off in the event of a short circuit on the secondary side.

The natural ripple of the rectified high voltage is 4% in the case of twelve-phase rectification and must be reduced by an LC filter in order to improve beam quality.

However, the guns used for the vacuum treatment of metals mostly provide focused beams developing very high specific powers at their place of maximum focus. Powers of this nature are likely to cause rapid evaporation of the material of the target to be worked on—i.e., to produce a gas mass which diffuses rapidly in the gap between the gun and the article and in the interior space of the gun and creates an environment which can be ionized by collisions between the beam electrons.

In this event ionization is responsible for a discharge and even arcing between the gun and the or each workpeice—i.e., between the two secondary terminals of the high-voltage power supply. The discharge short-circuits the two secondary terminals of the power supply and results in instantaneous overload of such supply, damage to the electrodes and craters in the article.

As a rule, the high-voltage generators for supplying guns are protected against overload by systems which, on the basis of measuring the gun current, operate a rupturing device in the primary or act on control semiconductors or transistors or thyristors.

Unfortunately, these systems have a response time which is long in relation to the appearance of electrode damage and to cratering of the workpiece, with the possible result of irreversible faults occurring in the case of welding or heat treatment. Also, the known systems do not control the discharge of energy which has accumulated in electrostatic or electromagnetic form in the system.

Electron gun installations are also known which comprise a triode tube in series with the rectifier of the transformer and rectifier power pack, the triode tube, which is of appropriate power, serving to improve the operating condition of the conventional generators controlled on the primary side.

In this case the negative side of the rectifier is directly connected to the gun cathode by a conductor while the positive side of the rectifier is connected to the anode of a triode tube whose cathode is earthed by way of a resistance serving as means sensitive to the flow of the current forming the electron beam. The circuit is therefore closed by way of earth, which is taken as reference potential and to which the gun anode, the chamber and the article to be welded are connected. In this construction a voltage dependent upon the value of the current is produced across the resistance and can therefore, upon exceeding a predetermined value, cut off (block) the triode tube.

However, the power of these generators is limited by the power of the triode; also, their response times are limited because the cut-off phenomena are disturbed and slowed down by capacitative coupling effects of the secondary windings and the high-tension parts of the transformer and rectifier system with the low-tension parts and earth.

Consequently the triode has a very limited effect on discharges and the secondary effects thereof. Consequently, these known installations cannot completely and effectively obviate the disadvantage hereinbefore set out and in some critical applications, such as the welding of light alloys or thick steel plates or in heat treatment operations, cause frequent stoppages and the need to clear defects in the welded articles.

It is the object of this invention to obviate these disadvantages by providing effective means for completely obviating discharges in electron beam machines, mainly by obviating overcurrents, damage to electrodes and defects in the workpiece and, therefore, frequent interruptions of operations.

The invention also provides a number of advantages which represent a considerable advance in the electron beam machine art and in the gun supply art, namely:

Very accurate regulation of the high voltage applied to the gun, with reduced ripple (0.1%) and a very short response time;

Suppression of high-voltage fluctuation effects at the frequency of the rectified high-voltage ripple on electron beam focusing;

The possibility of direct modulation by the high voltage of the power generated by the gun at high frequencies.

The point is that the invention makes it possible to interrupt the high voltage applied to the gun cathode, then to restore it, in the very short total time of less than 2 milliseconds, which is the time needed for complete elimination by space diffusion of the ionization-causing vapours immediately ionization appears—i.e., immediately the resulting current increase exceeds an adjustable threshold of, for example, +10% of the rated current. Complete stoppage of the beam before any discharge obviates any risk of electrode damage. Also, an electron beam interruption lasting 2 milliseconds is unlikely to cause defects in the workpiece.

This invention also makes it possible to provide generators of unlimited power—i.e., capable of supplying all known electron guns.

The invention also makes it possible so to regulate the high voltage that ripple is very much less than in the prior art and to provide electron beams of improved characteristics.

The invention also makes it possible to have direct modulation of beam power.

The invention accordingly relates to an installation for electron beam metalworking, the installation comprising an electron gun whose cathode produces in a vacuum chamber an electron beam focussable on the article to be welded, a transformer and rectifier system outputting a rectified high voltage, the rectifier having its negative terminal connected to the gun cathode and its positive terminal connected to the gun anode to produce in this circuit a current producing the electron beam between the cathode and the article, a vacuum tube being disposed in the circuit and being associated with means sensitive to the current flowing in the circuit and adapted to interrupt such current when the same exceeds a predetermined value, characterised in that the positive terminal of the rectifier is connected to the gun anode by way of earth, the reference potential; and the vacuum tube associated with the current-flow-sensitive means is disposed in the connection between the negative terminal of the rectifier and the gun cathode.

According to another feature of the invention, the current-sensitive means are associated with the tube by way of a threshold triggering circuit having a short time constant and connected to the control grid of the tube to block the same and by way of a triggering holding circuit which operates in cascade with the triggering circuit and which prolongs the blockage of the tube for a time adjustable by adjusting means.

According to another feature of the invention, the triggering-holding circuit is connected for its control to the current-sensitive means by an optical fibre connection, the latter circuit also being connected by an optical fibre connection to the triggering circuit for its control.

According to another feature of the invention, the vacuum tubes have cooling means in the form of radiators and coils flowed through by a cooling fluid.

The invention is illustrated by way of non-limitative example in the accompanying drawings wherein.

Figure 1:
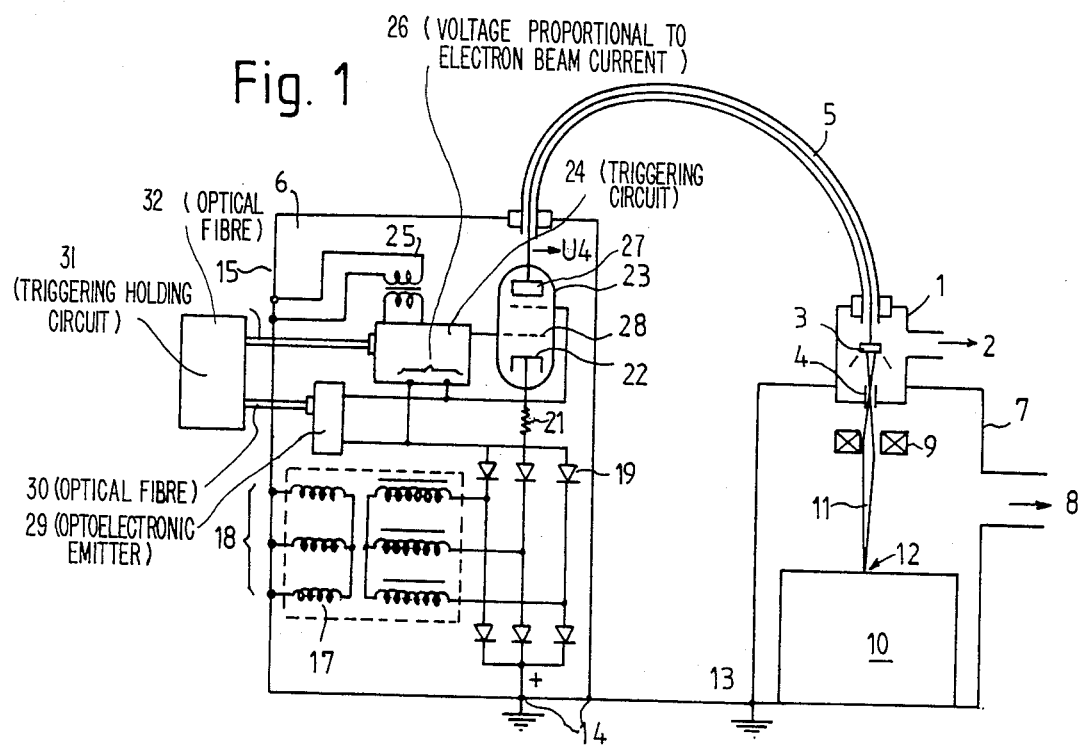
FIG. 1 is a diagrammatic side view of the complete installation.

The installation comprises a gun 1 which is exhausted by way of a tube 2 and which comprises an emitting cathode 3 and an anode 4. The cathode 3 is electrically connected by an insulated cable 5 to a power pack 6. The gun 1 is secured to a vacuum metal chamber 7 by way of a tube 8, the chamber 7 comprising a focusing coil 9 and receiving a workpiece 10.

When energized the gun 1 produces an electron beam 11 which is focused by the coil 9 at a place 12 on the workpiece 10.

The gun body is electrically connected to the chamber 7, which is earthed at a place 13, and to the power pack casing 15, which is earthed at a place 14. The casing 15 is a hermetic casing filled with an insulating oil and received a polyphase transformer 17 energized at 18 by the mains and having a silicon rectifier bridge 19 outputting a rectified voltage, the positive side of the bridge 19 being connected at the place 14 to the casing 15—i.e., to earth. The negative side of the bridge 19 is connected to one end of a measuring resistance 21 whose other end is connected to cathode 22 of a vacuum tube 23 which is in the form of a tetrode and whose anode 27 is connected to the cable 5.

As will be described hereinafter, the tube 23 is in fact embodied by a number of parallel-connected tetrodes.

Inside the casing 15 there is another circuit 24 energized by an isolating transformer 25. The circuit 24 is connected by its terminal 26 to the measuring resistance 21 in order to receive a voltage dependent upon the electron beam current and to act on control grid 28 of tetrode 23 in order to cut the same off immediately the current flowing through the resistance 21 exceeds a predetermined value.

The voltage across the resistance 21 also acts on an opto-electronic emitter 29 whose illumination depends upon the voltage across the resistance 21 and is transmitted by an optical fibre 30 to an optoelectronic detector disposed inside the electronic circuit 31. As will be seen hereinafter, the electronic circuit 24 acts as a circuit triggering the blockage of the tetrode 23 when the current flowing through the resistance 21 exceeds a predetermined value, whereas circuit 31 outside the casing 15 serves to maintain the blockage of the tube 23, as triggered by the circuit 24, for a predetermined period of time. Accordingly, the circuit 31 is connected to one input of the circuit 24 by way of an optical fibre 32 associated with its opto-electronics emitter and collector.

Auxiliary elements such as heating circuits for the cathodes of the tube 23 and gun 21, interlocks and so forth are not shown in FIG. 1.

This installation according to the invention can provide substantial available powers such as are needed for any kind of electron beam metalworking installation and can produce electron beam cut-offs which are virtually instantaneous since the cut-off occurs at the connection of the power pack 17–19 to the gun cathode 3—i.e., at the tetrode 23. The point is that in this construction the direct connection between the secondary windings of the transformer 17 and the rectifier 19, on the one hand, and earth, on the other hand, is maintained when the circuit is cut off by the tetrode 23, thus obviating capacitative coupling effects and leading to instantaneous cut-off of the electron beam. There can therefore be no short circuit discharge in the gun or in any other "live" part in the construction according to the invention, since the increase in current resulting from the inception of ionization is detected by the resistance 21 which cuts off the tube 23.

Since the invention obviates discharges in the electron beam machine, damaging overcurrents and, therefore, electrode damage and flawing of the workpiece are obviated.

Also, for the same reasons the installation according to the invention cuts out the frequent down times normally associated with the occurrence of overcurrent.

Consequently—i.e., because of using the cut-off means (tetrode 23) between the negative side of the rectifier 19 and the cathode 3—the high voltage is regulated very accurately, not only with a very brief response time but also with reduced ripple, with a resulting improvement in electron beam characteristics, notably of beam focusing at the place 12 of impact on the workpiece.

The point is that the instantaneous cut-off of high voltage from the cathode immediately ionization appears prevents any arc discharge with all its resulting disadvantages and enables the electron beam to be restored very rapidly—i.e., in a time which is too short for defects to occur in the workpiece 10 but long enough to allow diffusion of critical ionization.

To give some idea of the substantial rated power available in accordance with the invention, consideration will be given by way of example to an installation having a 30 kW gun producing an accelerating voltage of 60 kW, with the following electrical parameters.

The current flowing between the gun and the power pack is 500 mA, the cathode voltage to earth is 60 kV. The potential of the tetrode anode is also 60 kV neglecting the voltage drop in the cable 5. The working voltage of the tetrode 23 is 4 kV and the potential of the tetrode cathode 22 to earth is 64 kV, which is the on-load voltage delivered by the transformer and rectifier system 17–19.

In this case the 100% power dissipation of the tube 23 is 4 kV×500 mA—i.e., 2 kW.

For the sake of simplicity the current control electrode (Wehnelt cylinder) has not been shown in FIG. 1. However, this electrode serves to adjust the current flowing in the circuit—i.e., in the foregoing example to adjust the current from 0 to 500 mA. This load variation causes a variation in the voltage drop in the transformer 17 and, therefore, a variation in the accelerating voltage applied to the gun cathode 3.

Similarly, any random variation of the primary voltage applied to the transformer 17 reacts on the voltage of the cathode 3.

Clearly, however, because of the construction according to the invention this accelerating voltage is readily maintained constant by the automatic action, to be described hereinafter, of the circuit 24 on the tetrode control grid 28.

The action on the control grid 28 also helps to control the voltage of the cathode 3 from 0 to 100%—i.e., from 0 to 60 kV in the example hereinbefore set out. In this case the voltage between the cathode 3 and anode 4 of the tube 23 varies in inverse proportion and the power to be dissipated here increases when the voltage applied to the gun cathode decreases.

The most unfavourable case in this connection occurs when the voltage of the cathode 3 is 40 kV, its maximum flow being 250 mA because of the permeance of the gun. In this most unfavourable case the power dissipated by the tube 23 is 64−30=34 kV×250=8.5 kW.

According to the invention, therefore, only four tetrodes in parallel need to be used for this 30 kW gun producing a 60 kV accelerating voltage, each tetrode having a rated power of 1 kW.

Figure 2:
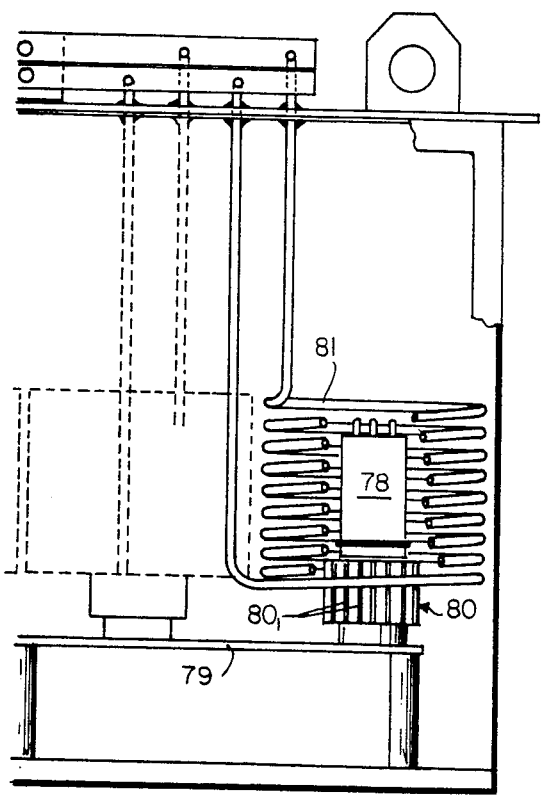
FIG. 2 is a partial and broken-away side view showing the method of assembly and of cooling of the tetrode tubes.

However, for these tetrodes connected in parallel or possibly in semiparallel to operate, means must be provided to ensure substantial heat dissipation from them. To this end, and as shown in FIG. 2, each tetrode 78 is secured to a support plate 79 made of a metal which is a good heat conductor, while near its anode a sleeve 80, also made of metal which is a good heat conductor and which is formed with peripheral grooves 80, in order to act as an effective radiator, is disposed around the tetrode. Also, a coil 81 through which a cooling liquid flows extends around each tetrode 78.

Figure 3:
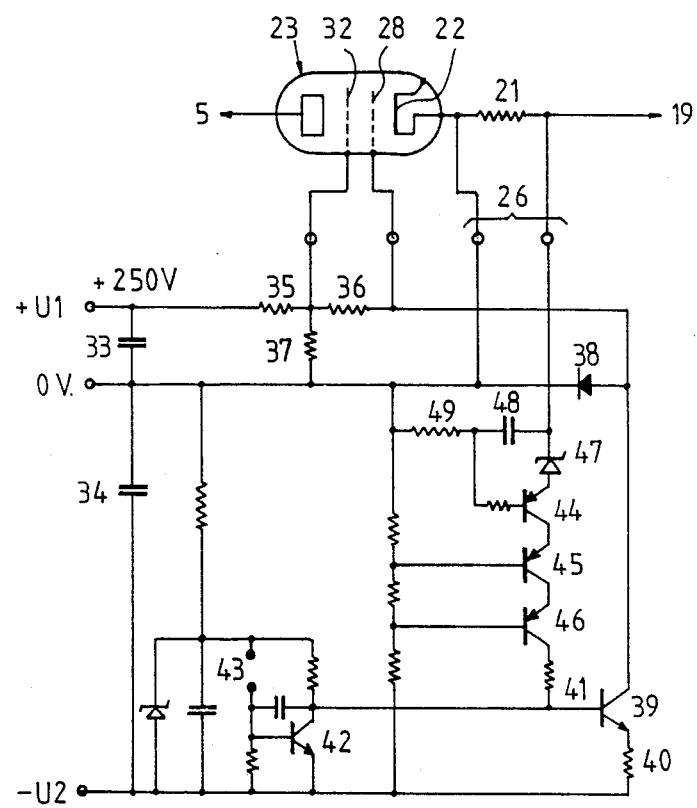
FIG. 3 shows the circuit diagram for the triggering circuit.

The triggering circuit 24 is shown in FIG. 3; its function is to regulate the high voltage applied to the gun cathode 3 and to cut the current off immediately in response to an overcurrent.

The circuit 24 is energized by two voltages U1 and U2 which are delivered by an isolating transformer 25 and which are applied to two capacitors 33, 34. The voltage U1 is, for example, 250 volts and the voltage U2 is, for example 600 volts.

Resistance 35–37 form a voltage divider for deriving from the voltage U1 the potentials of the grids 28 and 32 and of the cathode 22 of the tetrode 23, whose anode is connected to the conductor 5 and whose cathode is connected by way of the resistance 21 to the negative side of the rectifier system 19.

Through the agency of a rectifier 38 associated with a transistor 39 and with a resistance 40, the biasing of the control grid relatively to the cathode 22 and, therefore the potential difference between the anode and cathode of the tetrode 23 can be adjusted. Base current 41 of transistor 39 which determines whether or not the tube 23 is conductive by acting on its grid bias is first determined once and for all by the transistor 42, then instantaneously from the voltage across the resistance 21 and by the opening of three cascaded transistors 44–46; when the voltage across the resistance 21 exceeds a threshold determined by a Zener 47, the transistor 44 becomes conductive and causes a cascade opening of the transistors 45, 46, with the result that the transistor 39 becomes completely conductive and therefore biases the grid 28 heavily relatively to the cathode 22, thus blocking the tetrode 23 and immediately cutting off the electron beam.

The time constant of this circuit as detemined by the capacitor 48 and resistance 49 is very brief so that the tube and gun resume normal operation after a very short time of the order of 20 microseconds. However, the circuit 24 is also under the control of the circuit 31 which prolongs the blockage of the tube 23 for an adjustable period of time. Consequently, the only function of the circuit 24 is to control the conduction of the tube 23 and render the same non-conductive immediately an overcurrent appear, whereas the function of the circuit 31 is to keep the tube 23 cut off for a predetermined but adjustable time.

Figure 4:
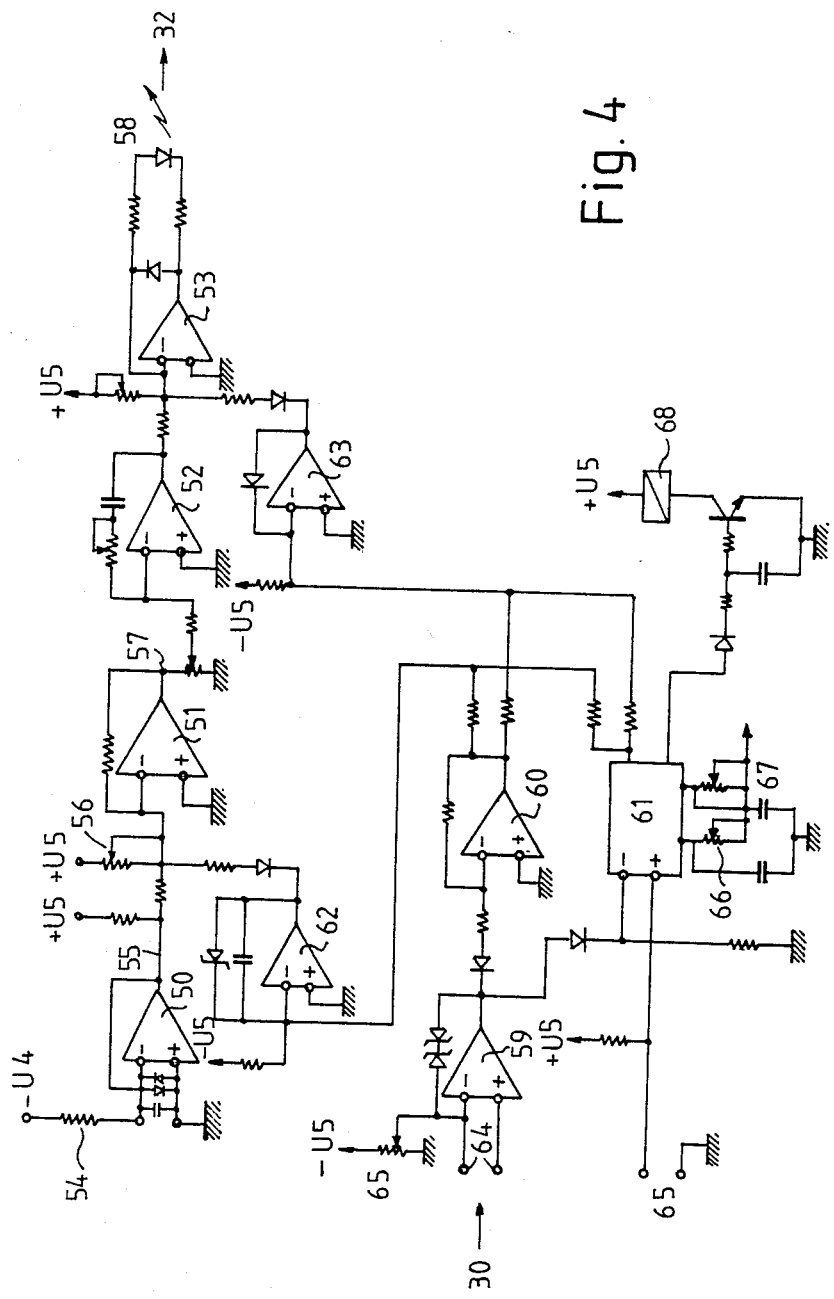
FIG. 4 shows the circuit diagram of the triggering-holding circuit.

The circuit 31 is illustrated in FIG. 4.

Its terminals 64 receive a voltage which depends on the voltage across the resistance 21 and which is transmitted by the optical fibre 30 and its optoelectronic collector and emitter. The circuit 31 also receives a supply voltage U4 which depends upon the high voltage and which is derived from the anode of the tetrode 23, and an operating voltage U5.

The circuit 31 produces across an electroluminescent diode 58 light data which is transmitted by the optical fibre 32 and its opto-electronic collector associated with the terminals 43 of circuit 24.

The input of a circuit 50 is connected in series with a resistance 54 receiving the supply voltage - U4 and the integrated circuit 50 delivers at its output 55 a low voltage which is an image of the high voltage. A circuit 51 compares the voltage 55 with the voltage from a potentiometer 56 to output an error voltage at a place 57. The integrated circuit 52 is an integrating amplifier and the integrated circuit 53 is an power amplifier supplying an electroluminescent diode 58 whose information is transmitted to the terminals 43 by the optical fibre 32.

All the integrated circuits 50–53 therefore form a high-voltage control loop, one of whose effects is to eliminate from the high voltage residual ripple due to the effect of the rectifiers 19.

The function of circuits 59–61 is to produce by way of circuits 62 and 63 a blocking signal at the output 58, such signal acting by way of transistor 42 of circuit 24 to keep the tetrode 23 blocked in response to an overcurrent through the resistance 21.

The current-dependent information reaches the terminals 64 by way of the fibre 30 while a current measurement by a resistance 65 disposed in the circuit at the positive terminal is applied to the single-state device 61.

When the current exceeds the threshold set by the potentiometer 65, the circuit 59 opens and, by way of the circuits 60, 62, 63, blocks the voltage loop. Consequently, the action of the circuit 59, delayed by the response times of the circuits relatively to the instantaneous response of the Zener diode 47 and transistor 39, continues to block the diode 47 and transistor 39.

The signal output at 65 also changes over the single-state circuit 61, the effect of which is identical to the effect of the circuit 59 but the duration of which is completely controlled by capacitors 66, 67.

The circuit 61 also drives a counter 68 which counts the number of blockages and which, by way of a circuit which is not shown, stops the installation in the event of frequent repetition of overcurrent such as would be caused, for instance, by a short circuit in the gun.

At the end of the delay period determined by the single state device 61 and subject to the overcurrent having been cleared, the circuits return to their normal states and the voltages regulation resumes its effect by immediately appying a voltage at the previous value.

Total stoppage consequent upon an overcurrent is therefore triggered by the circuit 24, then prolonged for a predetermined time by the circuit 61 to the extent that the overcurrent is the result of an ionization which has not yet caused a short circuit; in this case detection of the overcurrent causes the circuit 24 to cut off the electron beam immediately, the circuit 61 maintaining the cut-off for a time which is short enough to prevent defects occurring in the workpiece 10 but long enough for the ionized vapours produced to dissipate.

I claim:

1. Installation for working metal by electron beams comprising:

(a) an electron gun (1) having a cathode (3) that produces in a vacuum an electron beam (11) to be focused on a part (10) to be welded;
   (b) a transformer and rectifier system including a transformer (17) and rectifier (19) for producing a rectified high voltage at terminals of the rectifier (19) connected to the secondary of the transformer (17), the rectifier (19) being connected to the cathode (3) of the electron gun by its negative terminal via a vacuum tube (28) and associated current-flow-sensitive means (21) and to the anode (4) of the electron gun by its earth, the reference potential, the vacuum tube (28) interrupting the passage of current to the electron gun when its intensity exceeds a determined value, this installation being characterized in that;
   (c) the current-flow-sensitive means are associated with the tube by means of a triggering circuit (24) having a threshold with a short time constant (47, 48, 49), the triggering circuit being connected to a control grid (22) of the vacuum tube (23) so as to block the same when the electron gun current exceeds the determined value and by means of a triggering holding circuit (31) that operates in cascade with the triggering circuit (24) to extend the blocking of the tube (23) for a time adjustable by adjusting means.

2. An installation according to claim 1, characterised in that the triggering-holding circuit (31) is connected for its control to the current-sensitive means (21) by an optical fibre connection (30), the latter circuit also being connected by an optical fibre connection to the triggering circuit (24) for its control.

3. An installation according claim 1, characterised in that the vacuum tube takes the form of a number of parallel connected tetrodes (23).

4. An installation according to claim 3, characterised in that the vacuum tubes have cooling means in the form of radiators (39) and coils (31) flowed through by a cooling fluid.

5. An installation according to claim 1, characterised in that the means for adjusting the duration of tube blocking control adjustment of the blockage for a period longer than the diffusion time of the gas whose ionization caused the overcurrent and shorter than the beam stop time leading to the appearance of a defect in the article (10).

6. An installation according to claim 1, characterised in that the control grid (28) of the tube (23) is controlled for blocking by way of a transistor (39) which in normal operation receives on its base information dependent upon the value of the high voltage (U4) for its regulation.

* * * * *